(12) United States Patent
Kuan et al.

(10) Patent No.: US 9,705,512 B1
(45) Date of Patent: Jul. 11, 2017

(54) SELF-CALIBRATING FRACTIONAL-N PHASE LOCK LOOP AND METHOD THEREOF

(71) Applicant: Realtek Semiconductor Corporation, Hsinchu (TW)

(72) Inventors: Chi-Kung Kuan, Taoyuan (TW); Yu Zhao, San Jose, CA (US); Chia-Liang Lin, Fremont, CA (US)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/271,182

(22) Filed: Sep. 20, 2016

(51) Int. Cl.
*H03L 7/06* (2006.01)
*H03L 7/089* (2006.01)
*H03L 7/099* (2006.01)
*H03L 7/197* (2006.01)

(52) U.S. Cl.
CPC .......... *H03L 7/0891* (2013.01); *H03L 7/0995* (2013.01); *H03L 7/1974* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,847,615 A | * | 12/1998 | Roth | ........................ H03L 7/185 327/105 |
| 6,137,368 A | * | 10/2000 | Cho | ........................ H03L 7/183 327/156 |
| 6,614,841 B1 | * | 9/2003 | Ohta | ........................ G11B 20/10 327/156 |
| 7,804,341 B2 | * | 9/2010 | Bazes | ............... H03K 3/356113 327/147 |
| 7,999,622 B2 | | 8/2011 | Galton et al. | |
| 2008/0197830 A1 | * | 8/2008 | Mehas | .................... H03L 7/085 323/318 |
| 2010/0039182 A1 | * | 2/2010 | Galton | ................... H03K 23/54 331/1 A |
| 2010/0253402 A1 | * | 10/2010 | Awata | ..................... G01S 19/29 327/156 |
| 2012/0280730 A1 | * | 11/2012 | Obkircher | ................. H03L 7/08 327/157 |

(Continued)

*Primary Examiner* — Adam Houston
(74) *Attorney, Agent, or Firm* — WPAT, P.C.; Anthony King

(57) ABSTRACT

A circuit receives a reference clock and output an output clock in accordance with a clock multiplication factor, the circuit comprising: a digitally controlled timing adjustment circuit, a timing detection circuit, a loop filter, a controllable oscillator, a clock divider, a modulator, and a calibration circuit, wherein the modulator is configured to modulate a clock multiplication factor into a division factor and also calculate a pre-known noise caused by the modulation, and the digitally controlled timing adjustment circuit, the timing detection circuit, the loop filter, the controllable oscillator, and the clock divider form a feedback loop such that a frequency of the output clock is equal to a frequency of the reference clock multiplied by the clock multiplication, but a pre-known noise caused by the modulation is corrected by the digitally controlled timing adjustment circuit, which is calibrated by the calibration circuit in a closed-loop manner to minimize a correlation between the pre-known noise and an output of the timing detection circuit.

18 Claims, 10 Drawing Sheets

(56) References Cited

U.S. PATENT DOCUMENTS

| | | | | |
|---|---|---|---|---|
| 2013/0082754 A1* | 4/2013 | Chern | .................... | H03L 7/099 |
| | | | | 327/157 |
| 2014/0327477 A1* | 11/2014 | Chiang | .................... | H03L 7/08 |
| | | | | 327/156 |
| 2015/0145567 A1* | 5/2015 | Perrott | .................... | H03L 7/093 |
| | | | | 327/156 |
| 2015/0222469 A1* | 8/2015 | Onishi | .................... | H04B 1/10 |
| | | | | 375/376 |
| 2015/0349785 A1* | 12/2015 | Erdogan | ............... | H03L 7/0807 |
| | | | | 375/374 |
| 2015/0349786 A1* | 12/2015 | Erdogan | ............... | H03L 7/0807 |
| | | | | 375/375 |
| 2015/0381190 A1* | 12/2015 | Goyal | .................... | H04B 1/40 |
| | | | | 455/76 |
| 2016/0191284 A1* | 6/2016 | Izawa | .................... | H04B 15/04 |
| | | | | 375/375 |

* cited by examiner

SELF-CALIBRATING FRACTIONAL-N PHASE LOCK LOOP AND METHOD THEREOF

BACKGROUND OF THE INVENTION

1. Field of the Invention

The present invention generally relates to phase lock loops.

2. Description of Related Art

Persons of ordinary skill in the art understand terms and basic concepts related to microelectronics that are used in this disclosure, such as "voltage," "current," "signal," "logical signal," "clock," "rising edge," "phase," "capacitor," "charge," "charge pump," "transistor," "MOS (metal-oxide semiconductor)," "PMOS (p-channel metal oxide semiconductor)," "NMOS (n-channel metal oxide semiconductor)," "source," "gate," "drain," "circuit node," "ground node," "operational amplifier," "common-mode feedback," "electrical potential," "switch," "single-ended circuit," and "differential circuit." Terms and basic concepts like these are apparent to those of ordinary skill in the art and thus will not be explained in detail here.

Through this disclosure, a logical signal is a signal of two states: "high" and "low," which can also be re-phrased as "1" and "0." For brevity, a logical signal in the "high" ("low") state is simply stated as the logical signal is "high" ("low"), or alternatively, the logical signal is "1" ("0"). Also, for brevity, quotation marks may be omitted and the immediately above is simply stated as the logical signal is high (low), or alternatively, the logical signal is 1 (0), with the understanding that the statement is made in the context of describing a state of the logical signal.

A logical signal is said to be asserted when it is high. A logical signal is said to be de-asserted when it is low.

A clock signal is a cyclic logical signal. For brevity, hereafter, "clock signal" may be simply referred to as "clock."

A timing of a clock signal refers to a time instant where the clock signal undergoes a transition of state, either a low-to-high transition or a high-to-low transition. When a clock signal undergoes a low-to-high (high-to-low) transition, a rising (falling) edge is observed in a timing diagram.

A phase lock loop (PLL) receives a first clock and outputs a second clock such that a phase of the second clock tracks a phase of the first clock. As a result, a frequency of the second clock is determined by a frequency of the first clock. A prior art phase lock loop comprises a phase/frequency detector (hereafter PFD), a charge pump (hereafter CP) circuit, a loop filter (hereafter LF), a voltage-controlled oscillator (hereafter VCO), and a clock divider circuit, wherein: the VCO outputs the second clock in accordance with a control voltage such that the frequency of the second clock is determined by the control voltage, the clock divider circuit receives the second clock and outputs a third clock in accordance with a division ratio, the PFD receives the first clock and the third clock and outputs a timing signal representing a difference in timing between the first clock and the third clock, the CP circuit converts the timing signal into a current signal, the LF filters the current signal to establish the control voltage to control the frequency of the second clock. The frequency of the second clock is thus adjusted in a closed loop manner to track a frequency of the first clock. "Phase/frequency detector," "charge pump circuit," "loop filter," "voltage-controlled oscillator," and "clock divider circuit" are all well known in the prior art and thus not described in detail here. In a steady state, the frequency of the second clock is equal to the frequency of the first clock multiplied by a multiplication factor N that can be expressed as $$N = N_{int} + \alpha$$

where $N_{int}$ is a positive integer and $\alpha$ is a rational number smaller than 1 (one) but not smaller than 0 (zero). If $\alpha$ is zero, the clock divider circuit has a fixed division factor $N_{int}$, i.e. it performs a "divide by $N_{int}$" function wherein one cycle of the third clock is output for every $N_{int}$ cycles of the second clock. If $\alpha$ is nonzero, it must be a fractional number; in this case, the phase lock loop is referred to as "fractional-N PLL," and the clock divider circuit cannot have a fixed division factor. In an embodiment, the division factor of the clock divider circuit is modulated by a delta-sigma modulator and dynamically toggle between $N_{int}$ and $N_{int}+1$ such that a mean value of the division factor is equal to $N_{int}+\alpha$. Since the value of the division factor is modulated, an instantaneous value differs from a mean value of the division factor (e.g., $N_{int}$ and $N_{int}+1$ are different from $N_{int}+\alpha$), resulting in an instantaneous noise additive to the PLL. In U.S. Pat. No. 7,999,622, Galton et al disclosed a method to cancel the additive noise resulting from the modulation of the division factor. The method is based on using a digital-to-analog converter to output a current that offsets an additive noise in the output of the charge pump circuit (resulting from the modulation of the division factor). The digital-to-analog converter (DAC), however, contributes thermal noise. To reduce the thermal noise contribution, a large current can be used at the cost of high power consumption. Besides, in practice the DAC is not perfectly linear, and its nonlinearity can contribute additional noise to PLL. To reduce the adverse effect of the nonlinearity of the DAC, a dynamic element matching can be used at the cost of high circuit complexity.

What is disclosed is a method for cancelling a noise in a fractional-N PLL resulting from a modulation of a division factor without consuming high power or demanding high circuit complexity.

SUMMARY OF THE INVENTION

An aspect of the present invention is to use a digitally controlled timing adjustment circuit to correct a pre-known timing error in a fractional-N phase lock loop due to a modulation of a division factor of a clock divider, wherein a gain of the digitally controlled timing adjustment circuit is calibrated in a closed-loop manner based upon a correlation between the pre-known timing error and a residual timing error of an output of the digitally controlled timing adjustment circuit.

In an embodiment, a circuit comprises: a digitally controlled timing adjustment circuit configured to receive a first clock and a second clock and output a third clock and a fourth clock in accordance with a noise cancellation signal and a gain control signal; a timing detection circuit configured to receive the third clock and the fourth clock and output a timing error signal; a filtering circuit configure to receive the timing error signal and output an oscillator control signal; a controllable oscillator configured to receive the oscillator control signal and output a fifth clock; a clock divider configured to receive the fifth clock and output the second clock in accordance with a division factor; a modulator configured to receive a clock multiplication factor and output the division factor and the noise cancellation signal, wherein a mean value of the division factor is equal to the clock multiplication factor; and a calibration circuit configured to receive the timing error signal and the noise cancellation signal and output the gain control signal. In an embodiment, a timing difference between the fourth clock and the third clock is equal to a sum of: a timing difference between the second clock and the first clock, the noise cancellation signal scaled by the gain control signal, and a fixed timing offset. In an embodiment, the digitally controlled timing adjustment circuit comprises: a fixed-delay circuit configured to receive the second clock and output the fourth clock, and a digitally controlled variable-delay circuit configured to receive the first clock and output the third clock in accordance with the noise cancellation signal and the gain control signal. In an embodiment, a delay of the digitally controlled variable delay circuit is linearly dependent on the noise cancellation signal and also linearly dependent on the gain control signal. In an embodiment, the digitally controlled variable delay circuit comprises a tunable inverter controlled by the gain control signal and a variable capacitor controlled by the noise cancellation signal. In an embodiment, the calibration circuit comprises a charge pump configured to receive the timing error signal and output an intermediate current signal in accordance with a common-mode feedback voltage, a single-pole-double-throw switch controlled by a sign of the noise cancellation signal, an integrator configured to receive the intermediate current signal via the single-pole-double-throw switch and output the gain control signal, and a common-mode feedback network configured to receive a first voltage at a positive input terminal and a second voltage at a negative input terminal of the integrator and output the common mode feedback voltage, wherein: a first throw of the single-pole-double-throw switch couples to the positive input terminal of the integrator, and a second throw of the single-pole-double-throw switch couples to the negative input terminal of the integrator. In an embodiment, the modulator is a first order delta-sigma modulator. In an embodiment, the controllable oscillator is a voltage-controlled oscillator. In an embodiment, the clock divider is a counter.

In an embodiment, a method comprises: receiving a first clock and a clock multiplication factor; modulating the clock multiplication factor into a division factor, wherein a mean value of the division factor is equal to the clock multiplication factor; establishing a noise cancellation signal in accordance with a difference between the clock multiplication factor and the division factor; deriving a third clock and a fourth clock from the first clock and a second clock using a digitally controlled timing adjustment circuit in accordance with a noise cancellation signal and a gain control signal; establishing a timing error signal by detecting a timing difference between the fourth clock and the third clock; filtering the timing error signal into an oscillator control signal; outputting a fifth clock in accordance with the oscillator control signal using a controllable oscillator; outputting the second clock by dividing down the fifth clock in accordance with the division factor; and adjusting the gain control signal in accordance with a correlation between the timing error signal and the noise cancellation signal. In an embodiment, the digitally controlled timing adjustment circuit comprises: a fixed-delay circuit configured to receive the second clock and output the fourth clock, and a digitally controlled variable-delay circuit configured to receive the first clock and output the third clock in accordance with the noise cancellation signal and the gain control signal. In an embodiment, a delay of the digitally controlled variable delay circuit is linearly dependent on the noise cancellation signal and also linearly dependent on the gain control signal. In an embodiment, the digitally controlled variable delay circuit comprises a tunable inverter controlled by the gain control signal and a variable capacitor controlled by the noise cancellation signal. In an embodiment, adjusting the gain control signal comprises using a calibration circuit comprising: a charge pump configured to receive the timing error signal and output an intermediate current signal in accordance with a common-mode feedback voltage, a single-pole-double-throw switch controlled by a sign of the noise cancellation signal, an integrator configured to receive the intermediate current signal via the single-pole-double-throw switch and output the gain control signal, and a common-mode feedback network configured to receive a first voltage at a positive input terminal and a second voltage at a negative input terminal of the integrator and output the common mode feedback voltage, wherein: a first throw of the single-pole-double-throw switch couples to the positive input terminal of the integrator, and a second throw of the single-pole-double-throw switch couples to the negative input terminal of the integrator. In an embodiment, the modulator is a first order delta-sigma modulator. In an embodiment, the controllable oscillator is a voltage-controlled oscillator. In an embodiment, the clock divider is a counter.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention relates to phase lock loops. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1A:
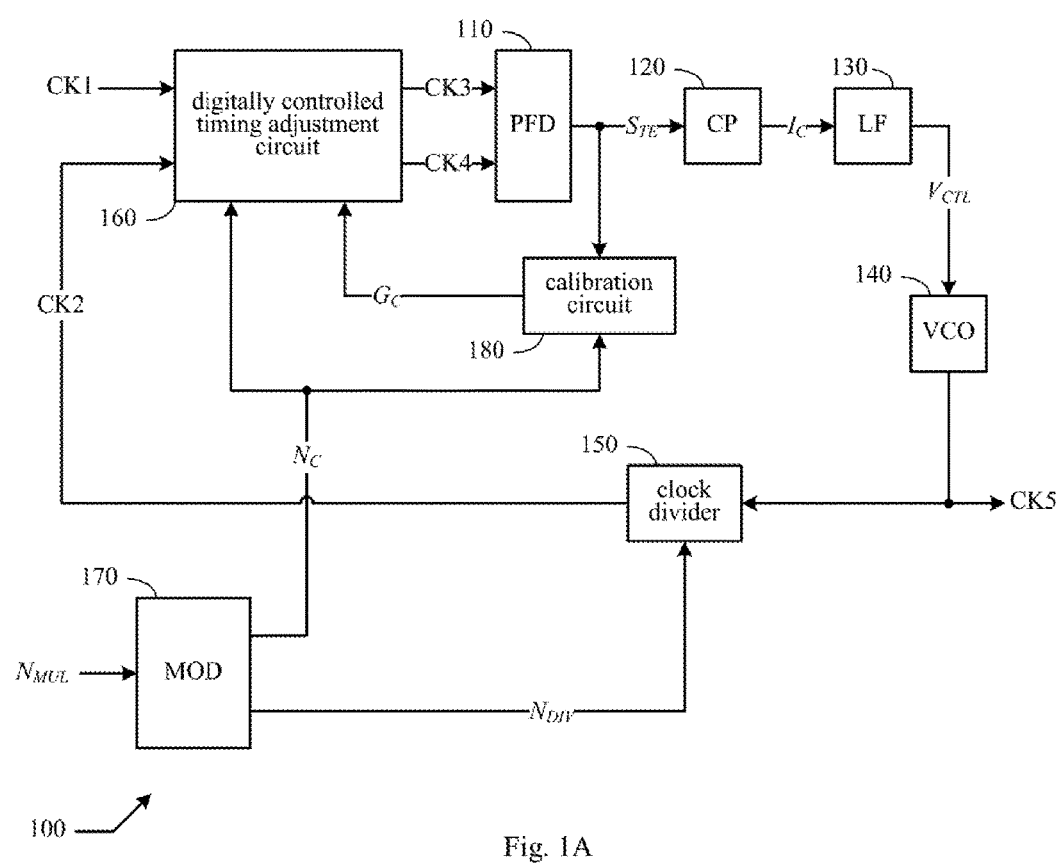
FIG. 1A shows a functional block diagram of a fractional-N phase lock loop in accordance with an embodiment of the present invention.

FIG. 1A shows a functional block diagram of a PLL 100 in accordance with an embodiment of the present invention. PLL 100 comprises: a digitally controlled timing adjustment circuit 160 configured to receive a first clock CK1 and a second clock CK2 and output a third clock CK3 and a fourth clock CK4 in accordance with a noise cancellation signal $N_C$ and a gain control signal $G_C$; a phase/frequency detector (PFD) 110 configured to receive the third clock CK3 and the fourth clock CK4 and output a timing error signal $S_{TE}$ representing a timing difference between the third clock CK3 and the fourth clock CK4; a charge pump (CP) 120 configured to convert the timing error signal $S_{TE}$ into a correction current $I_C$; a loop filter (LF) 130 configured to receive the correction current $I_C$ and output a control voltage $V_{CTL}$; a voltage-controlled oscillator (VCO) 140 configured to output a fifth clock CK5 in accordance with the control voltage $V_{CTL}$; a clock divider 150 configured to receive the fifth clock CK5 and output the second clock CK2 in accordance with a division factor $N_{DIV}$; a modulator (MOD) 170 configured to output the division factor $N_{DIV}$ and the noise cancellation signal $N_C$ in accordance with a clock multiplication factor $N_{MUL}$; and a calibration circuit 180 configured to output the gain control signal $G_C$ in accordance with a correlation between the timing error signal $S_{TE}$ and the noise cancellation signal $N_C$. For brevity, hereafter the first (second, third, fourth, fifth) clock CK1 (CK2, CK3, CK4, CK5) is simply referred to as CK1 (CK2, CK3, CK4, CK5), the timing error signal $S_{TE}$ is simply referred to as $S_{TE}$, the correction current $I_C$ is simply referred to as $I_C$, the control voltage $V_{CTL}$ is simply referred to as $V_{CTL}$, the noise cancellation signal $N_C$ is simply referred to as $N_C$, the gain control signal $G_C$ is simply referred to as $G_C$, clock multiplication factor $N_{MUL}$ is simply referred to as $N_{MUL}$, and the division factor $N_{DIV}$ is simply referred to as $N_{DIV}$.

PLL 100 will be the same as the aforementioned prior art PLL if the digitally controlled timing adjustment circuit 160 and the calibration circuit 180 are removed and PFD 110 receive CK1 and CK2, instead of CK3 and CK4. Similar to the prior art PLL, PLL 100 receives CK1 and outputs CK5 using VCO 140, which is adjusted in a closed loop manner via a feedback path comprising the clock divider 150, PFD 110, CP 120, and LF 130, such that a frequency of CK5 is equal to a frequency of CK1 times $N_{MUL}$, which is not a pure integer. Since $N_{MUL}$ is not a pure integer but $N_{DIV}$ (which is the clock division factor of the clock divider 150) needs to be an integer, $N_{DIV}$ must be modulated in a way such that a mean value of $N_{DIV}$ equals $N_{MUL}$. Modulator 170 receives $N_{MUL}$ and outputs $N_{DIV}$, effectively modulating $N_{DIV}$ such that the mean value of $N_{DIV}$ equals $N_{MUL}$. In doing so, the average frequency of CK5 is equal to the frequency of CK1 times $N_{MUL}$, but an instantaneous timing of CK2 might deviate from an ideal timing of a fractional clock divider that allows a non-integer division factor of $N_{MUL}$. The deviation of the instantaneous timing of CK2 from the ideal timing due to the modulation of $N_{DIV}$ leads to an instantaneous noise in the timing difference between CK2 and CK1. However, the instantaneous noise of the timing difference between CK2 and CK1 due to the modulation of $N_{DIV}$ is pre-known. The instantaneous noise is calculated by the modulator 170 and represented by $N_C$. The digital controlled timing adjustment circuit 160 is configured to correct the instantaneous noise in the timing difference between CK2 and CK1 due to the modulation of $N_{DIV}$, such the timing difference between CK4 and CK3 is free of the instantaneous noise. However, $N_C$ is numeric and digital in nature, while the timing difference between CK2 and CK1 is temporal analog in nature. A function of digital-to-analog conversion is performed by the digitally controlled timing adjustment circuit 160 to convert $N_C$ into the amount of timing difference that needs to be cancelled. $G_C$ determines a gain control of the digital-to-analog conversion.

In an embodiment, a function of the digitally controlled timing adjustment circuit 160 can be described by the following mathematical expression:

$$t_4-t_3=t_2-t_1+N_C \cdot G_C+t_{OS} \quad (1)$$

Here, $t_1$ is a timing of a rising edge of CK1, $t_2$ is a timing of a rising edge of CK2, $t_3$ is a timing of a rising edge of CK3, $t_4$ is a timing of a rising edge of CK4, and $t_{OS}$ is a fixed timing offset. Here, $t_2-t_1$ is a timing difference between CK2 and CK1, while $t_4-t_3$ is a timing difference between CK4 and CK3. $S_{TE}$ represents a relative timing between CK4 and CK3 and is mathematically equal to $t_4-t_3$. $N_C$ presents the instantaneous noise in $t_2-t_1$ due to the modulation of $N_{DIV}$. If $G_C$, which is the conversion gain for converting $N_C$ into the timing difference to be cancelled, is set properly, the noise in $t_2-t_1$ due to the modulation of $N_{DIV}$ will be corrected and absent in $t_4-t_3$. On the other hand, if $G_C$ is not set properly, the noise will be either over-corrected or under-corrected, resulting in a residual noise in $t_4-t_3$ that will become a part of $S_{TE}$. When $G_C$ is set too large (small), the noise will be over-corrected (under-corrected); as a result, $t_4-t_3$ will contain a residual noise that is positively (negatively) correlated with $N_C$, and therefore a level of $S_{TE}$ will tend to be too high (low) when $N_C$ is positive and too low (high) when $N_C$ is negative. Calibration circuit 180 thus adjusts $G_C$ in accordance with a correlation between $N_C$ and $S_{TE}$: when $S_{TE}$ is positively (negatively) correlated with $N_C$, it indicates $G_C$ is too large (small) and needs to be decreased (increased).

Figure 1B:
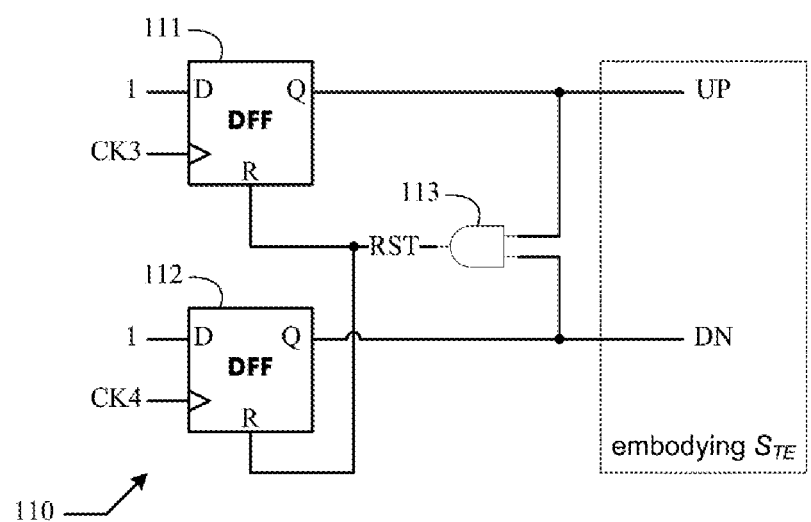
FIG. 1B shows a schematic diagram of a phase/frequency detector.

In an embodiment depicted in FIG. 1B, PFD 110 comprises two data flip-flops (DFF) 111 and 112 and an AND gate 113. Each DFF comprises an input terminal labeled "D," an output terminal labeled "Q," a reset terminal labeled "R," and a clock terminal denoted by a wedge symbol; such notations are widely used in the prior art. DFF 111 outputs a first logical signal UP while DFF 112 outputs a second logical signal DN. The AND gate 113 receives the two logical signals UP and DN and outputs a reset signal RST. The first (second) logical signal UP (DN) is asserted upon a rising edge of CK3 (CK4) and is de-asserted when the reset signal RST is asserted. The two logical signals UP and DN jointly embody the timing error signal $S_{TE}$ representing a timing difference between CK3 and CK4; such embodiment is widely used and well known in the prior art and thus not explained in detail here.

Figure 1C:
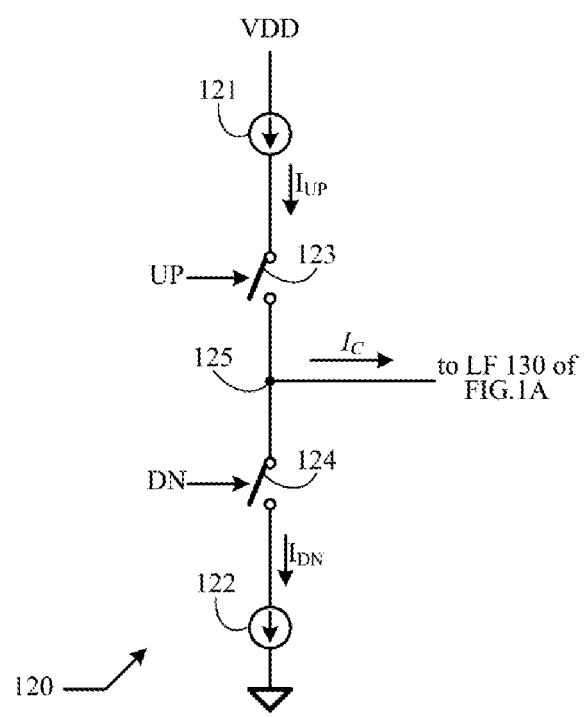
FIG. 1C shows a schematic diagram of a charge pump.

In an embodiment depicted in FIG. 1C, CP 120 comprises a current source 121 configured to source a charge-up current $I_{UP}$, a current sink 122 configured to sink a charge-down current $I_{DN}$, a first switch 123 configured to couple the charge-up current $I_{UP}$ to an output node 125 when the logical signal UP is asserted, and a second switch 124 configured to couple the charge-down current $I_{DN}$ to the output node 125 when the logical signal DN is asserted. The output node 125 interfaces with and provides the correction current $I_C$ to LF 130 of FIG. 1A. Throughout this disclosure, "VDD" denotes a power supply node. FIG. 1C is well known in the prior art and self-explanatory to those of ordinary skill in the art and thus not described in detail here.

Figure 1D:
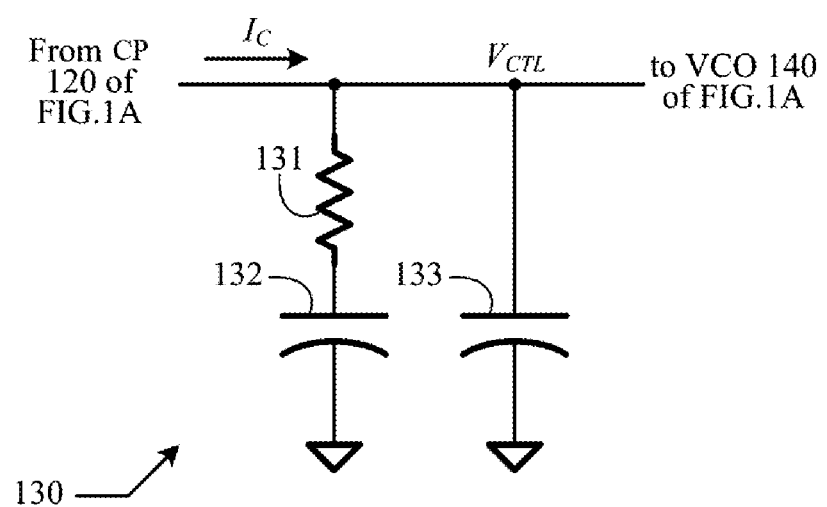
FIG. 1D shows a schematic diagram of a loop filter.

In an embodiment depicted in FIG. 1D, LF 130 comprises a resistor 131, a first capacitor 132, and a second capacitor 133, configured to receive the correction current $I_C$ from CP 120 of FIG. 1A and output the control voltage $V_{CTL}$ to VCO 140 of FIG. 1A. FIG. 1D is well known in the prior art and self-explanatory to those of ordinary skill in the art and thus not described in detail here.

Figure 1E:
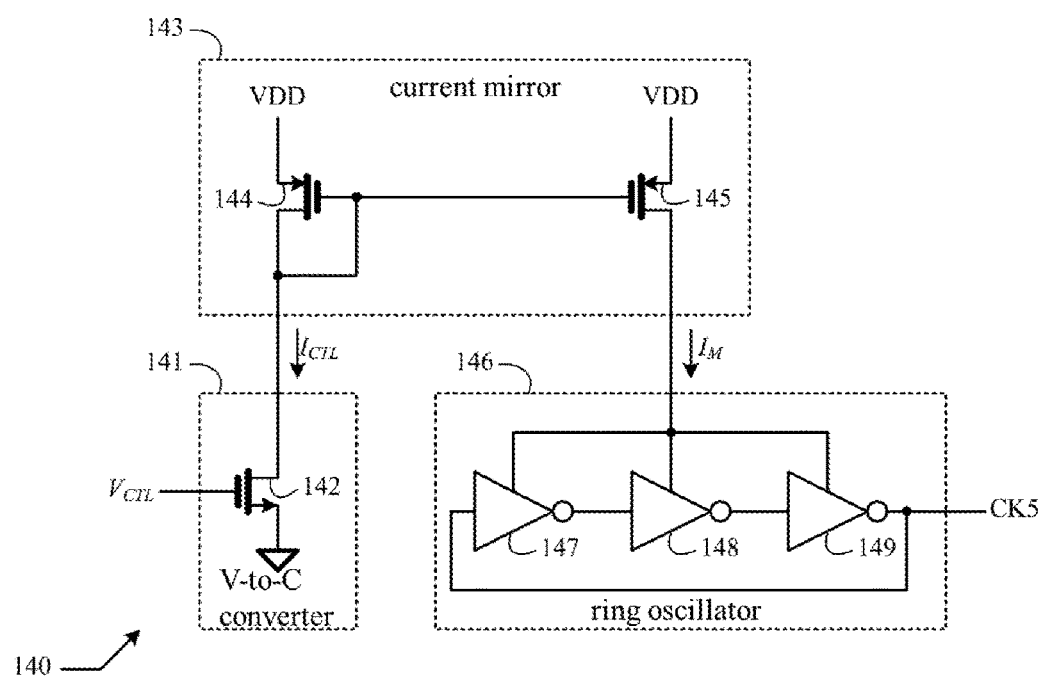
FIG. 1E shows a schematic diagram of a voltage-controlled oscillator.

In an embodiment depicted in FIG. 1E, VCO 140 comprises a voltage-to-current converter (V-to-C converter) 141 configured to convert the control voltage $V_{CTL}$ into a control current $I_{CTL}$, a current mirror 143 configured to mirror the control current $I_{CTL}$ into a mirrored current $I_M$, and a ring oscillator 146 configured to output CK5 in accordance with the mirrored current $I_M$. The voltage-to-current converter 142 comprises a NMOS transistor 142. The current mirror 143 comprises two PMOS transistors 144 and 145. The ring oscillator comprises three inverters 147, 148, and 149 configured in a ring topology, jointly receiving the mirror current $I_M$. When the control voltage $V_{CTL}$ rises, the control current $I_{CTL}$ rises, and so does the mirrored current $I_M$. As a result, the three inverters 147, 148, and 149 receive more power and become faster, resulting in a higher oscillation frequency for CK5.

Clock divider 150 can be embodied by a counter that increments a count upon a rising edge of CK5. The count starts with 0, increments to 1 upon a rising edge of CK5, then increments to 2 upon a next rising edge of CK5, and so on. When the count reaches $N_{DIV}-1$, it wraps around to 0 upon a next rising edge of CK5. In this manner, the counter cyclically counts from 0 to $N_{DIV}-1$. CK2 is asserted whenever the count equals 0, and de-asserted otherwise.

Digitally controlled timing adjustment circuit 160 receives CK1 and CK2 and outputs CK3 and CK4, so that a timing difference between CK4 and CK3 is related to a timing difference between CK2 and CK1 in accordance with a relation described by equation (1). In an embodiment depicted in FIG. 1F, digitally controlled timing adjustment circuit 160 comprises: a fixed-delay circuit 161 configured to receive CK2 and output CK4, and a digitally controlled variable-delay circuit 162 configured to receive CK1 and output CK3 in accordance with $G_C$ and $N_C$. The fixed-delay circuit 161 provides a fixed timing difference between CK4 and CK2; that is, $t_4-t_2$ is fixed. On the other hand, the digitally controlled variable-delay circuit 162 provides a variable timing difference between CK3 and CK1 and the variable timing difference is controlled by $G_C$ and $N_C$; that is, $t_3-t_1$ is variable and controlled by $G_C$ and $N_C$. As a result, $t_4-t_3$ is different from $t_2-t_1$ by a variable amount controlled by $G_C$ and $N_C$. In particular, the variable timing difference is linearly dependent on $N_C$, and also linearly dependent on $G_C$. In an embodiment, the fixed-delay circuit 161 is simply a short circuit; in this case, the fixed delay is zero and CK3 is the same as CK1. In an alternative embodiment, the fixed-delay circuit is an inverter chain that includes an even number of inverters configured in a cascade topology.

In an embodiment, $G_C$ is a differential signal comprising a first end $G_{C+}$ and a second end $G_{C-}$, wherein $G_C \equiv G_{C+} - G_{C-}$. By way of example but not limitation, $N_C$ is a four-bit word comprising four bits $N_C[0]$, $N_C[1]$, $N_C[2]$, and $N_C[3]$. In an embodiment depicted in FIG. 1G, the digitally controlled variable-delay circuit 162 comprises: a tunable inverter 167 configured to receive CK1 and output an intermediate clock CM at a circuit node 165 in accordance with a control by with $G_C$; an output inverter 168 configured to receive the intermediate clock CKI and output CK3; and a variable capacitor 166 configured to provide a capacitive load at the circuit node 165. The tunable inverter 167 comprises: a first PMOS transistor MP1 configured to provide a source current $I_{SC}$ in accordance with $G_{C+}$; a first NMOS transistor MN1 configured to provide a sink current $I_{SK}$ in accordance with $G_{C-}$; a second PMOS transistor MP2 controlled by CK1 and configured to enable the source current $I_{SC}$ to charge the variable capacitor 166 when CK1 is low; and a second NMOS transistor MN2 controlled by CK1 and configured to enable the sink current $I_{SK}$ to discharge the variable capacitor 166 when CK1 is high. The variable capacitor 166 comprises four capacitors 163_0, 163_1, 163_2, and 163_3 configured to conditionally shunt the circuit node 165 to ground via four switches 164_0, 164_1, 164_2, and 164_3 in accordance with $N_C[0]$, $N_C[1]$, $N_C[2]$, and $N_C[3]$, respectively. The output inverter 168 serves as an inverting buffer, and together with the tunable inverter 167 causes CK3 to be the same as CK1 except for a delay. In an embodiment, a capacitance of the variable capacitor 166 increases linearly with a value of $N_C$. A low-to-high (high-to-low) transition of CK1 will cause the tunable inverter 161 to discharge (charge) the variable capacitor 166 via the second NMOS (PMOS) transistor MN2 (MP2) using the sink (source) current $I_{SK}$ ($I_{SC}$), resulting in a high-to-low (low-to-high) transition of CKI. In an embodiment, a magnitude of the source (sink) current $I_{SC}$ ($I_{SK}$) is negatively linearly dependent on $G_{C+}$ ($G_{C-}$), i.e. a positive increment of $G_{C+}$ ($G_{C-}$) leads to a negative increment of the source (sink) current $I_{SC}$ ($I_{SK}$). The time that CKI takes to finish the high-to-low (low-to-high) transition in response to the low-to-high (high-to-low) transition of CK1 is linearly dependent on a total capacitance at the circuit node, but negatively linearly dependent on the magnitude of the sink (source) current $I_{SK}$ ($I_{SC}$). Since the capacitance of the variable capacitor is linearly dependent on the value of $N_C$ and the magnitude of the source (sink) current $I_{SC}$ ($I_{SK}$) is negatively linearly dependent $G_{C+}$ ($G_{C-}$), the time that the intermediate clock CM takes to finish the transition is approximately linearly dependent on $N_C$ and also linearly dependent on $G_C$. Therefore, digitally controlled timing adjustment circuit 160 effectively embodies equation (1).

The calibration circuit 180 outputs $G_C$ based on a correlation between $S_{TE}$ and $N_C$. In an embodiment, $G_C$ is established in accordance with an algorithm of adaptation described by the following equation $$G_C^{(new)} = \begin{cases} G_C^{(old)} - \mu \cdot S_{TE} & \text{if } N_C > 0 \\ G_C^{(old)} & \text{if } N_C = 0 \\ G_C^{(old)} + \mu \cdot S_{TE} & \text{if } N_C < 0 \end{cases} \quad (2)$$

Figure 2:
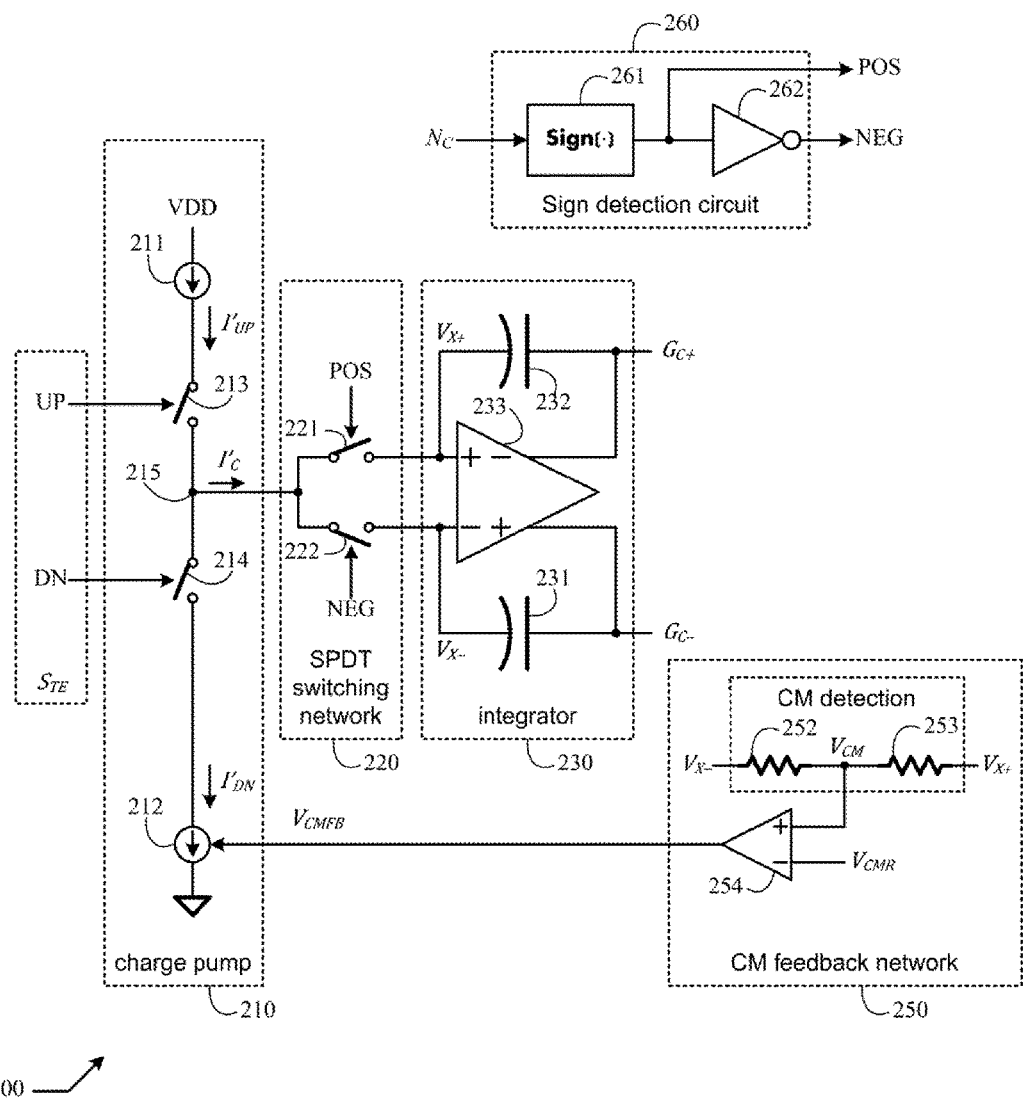
FIG. 2 shows a schematic diagram of a calibration circuit.

Here, $\mu$ is an adaptation constant, $G_C^{(old)}$ is a value before adaptation, and $G_C^{(new)}$ is a value after adaptation. A calibration circuit 200 depicted in FIG. 2 can be used to embody the calibration circuit 180 of FIG. 2 in accordance with the algorithm of adaptation described in equation (2). Calibration circuit 200 comprises: a charge pump 210 configured to receive $S_{TE}$, which comprises UP and DN as explained earlier, and output an intermediate current signal $I'_C$ in accordance with a common-mode feedback voltage $V_{CMFB}$; an integrator 230 configured to receive the intermediate current signal $I'_C$ via a single-pole-double-throw (SPDT) switching network 220 and output the gain control signal $G_C$ comprising the first end $G_{C+}$ and the second end $G_{C-}$; and a common-mode feedback network 250 configured to output the common-mode feedback voltage $V_{CMFB}$. The calibration circuit 200 further comprises a sign detection circuit 260 configured to receive $N_C$ and output a pair of logical signals POS and NEG that are used to control SPDT switching network 220. CP 210 comprises a current source 211 configured to source a charge-up current $I'_{UP}$, a current sink 212 configured to sink a charge-down current $I'_{DN}$, a first switch 213 configured to couple the charge-up current $I'_{UP}$ to an output node 215 when the logical signal UP is asserted, and a second switch 214 configured to couple the charge-down current $I'_{DN}$ to the output node 215 when the logical signal DN is asserted. The output node 215 interfaces with and provides the intermediate current signal $I'_C$ to the SPDT switching network 220. The sign detection circuit 260 comprises a sign operator 261 and an inverter 262. When $N_C$ is positive, POS is asserted and NEG is de-asserted. When $N_C$ is negative, POS is de-asserted and NEG is asserted. When $N_C$ is zero, POS and NEG are both de-asserted. The two logical signals POS and NEG, therefore, represents a sign of $N_C$. The SPDT switching network 220 comprises two switches 221 and 222 controlled by the two logical signals POS and NEG, respectively. The integrator 230 comprises a fully differential operational amplifier 233 and two capacitors 231 and 232 configured in a negative feedback topology. The fully differential operational amplifier 233 comprises two input terminals labeled as "+" and "−" on the left side and two output terminals labeled as "+" and "−" on the right side. The voltages at the two input terminals are $V_{X+}$ and $V_{X-}$, respectively. The voltages at the two output terminals are $G_{C-}$ and $G_{C+}$, respectively. When $N_C$ is positive and consequently POS is asserted, the capacitors 232 is charged (discharged) by $I'_C$ via the switch 221 if $I'_C$ is positive (negative), resulting in a decrement (increment) of $G_{C+}$, and thus a decrement (increment) of $G_C$. When $N_C$ is negative and consequently NEG is asserted, the capacitors 231 is charged (discharged) by $I'_C$ via the switch 222 if $I'_C$ is positive (negative), resulting in a decrement (increment) of $G_{C-}$, and thus an increment (decrement) of $G_C$. Also, the intermediate current signal $I'_C$ is a current-mode representation of $S_{TE}$. Therefore, $G_C$ is adjusted with an incremental amount proportional to $-S_{TE}$ when $N_C$ is positive, and proportional to $S_{TE}$ when $N_C$ is negative. As a result, $G_C$ is adjusted with an incremental amount proportional to $S_{TE}$ when $N_C$ is positive, and proportional to $-S_{TE}$ when $N_C$ is negative. The calibration circuit 200 thus embodies the function described by equation (2).

The CM feedback network 250 comprises: two resistors 252 and 253 configured to form a serial connection between $V_{X+}$ and $V_{X-}$ to tap a common-mode voltage $V_{CM}$ (i.e., to do CM detection), and an operational amplifier 254 configure to receive a common-mode reference voltage $V_{CMR}$ at an non-inverting terminal (labeled by "+") and the common-mode voltage $V_{CM}$ at an inverting terminal (labeled by "−") and output a common-mode feedback voltage $V_{CMFB}$ to control the charge-down current $I'_{DN}$. In an alternative embodiment not shown in figure, the common-mode feedback voltage $V_{CMFB}$ to control the charge-down current $I'_{UP}$. In either case, the CM feedback network 250 adjusts a part of the charge pump 210 in a closed loop manner, so that a mean value of $V_{X+}$ and $V_{X-}$ will be approximately equal to $V_{CMR}$. Common-mode feedback is well known to those of ordinary skill in the art and thus not described in detail here.

Figure 3:
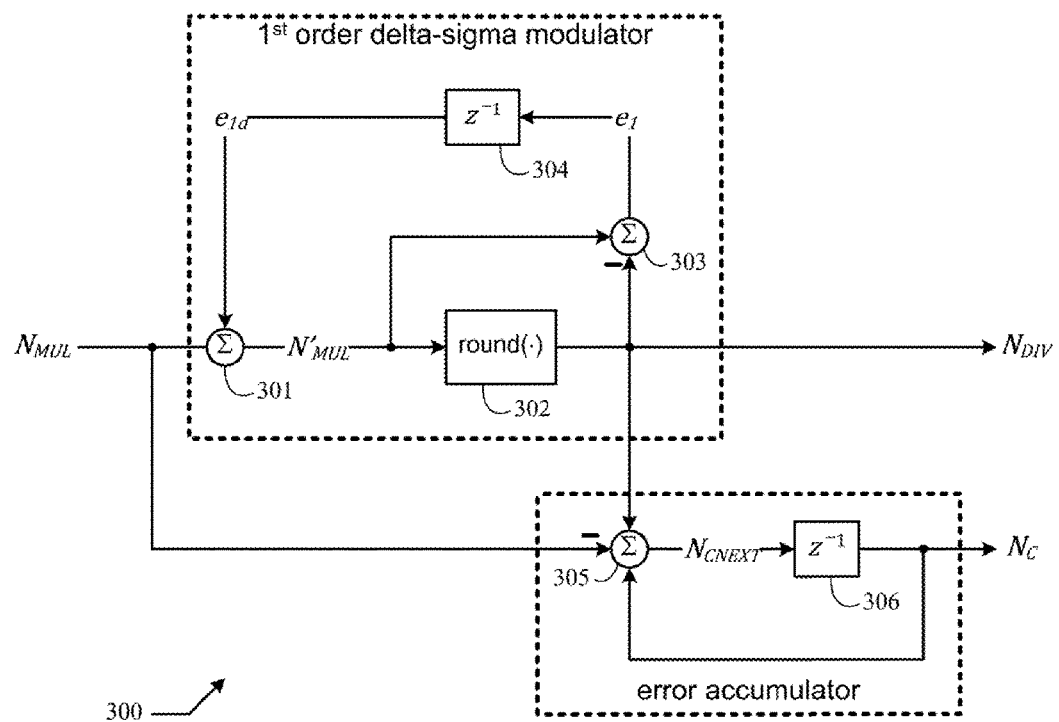
FIG. 3 shows a schematic diagram of a modulator.
Figure 4:
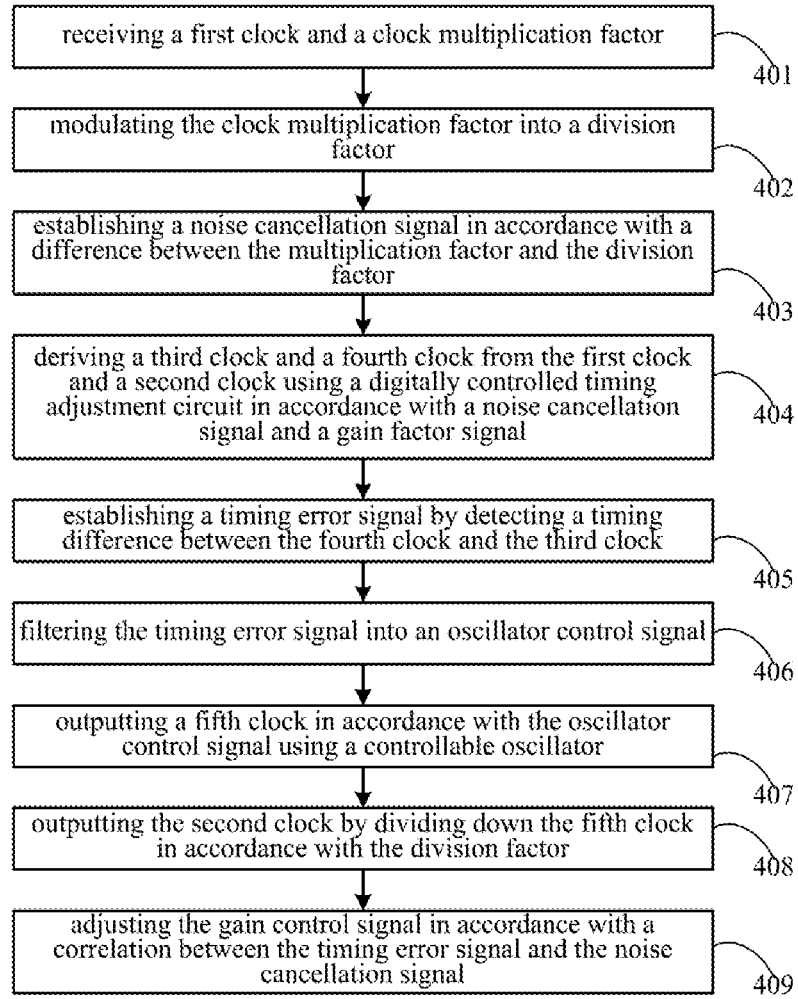
FIG. 4 shows a flow diagram of a method in accordance with the present invention.

In an embodiment, MOD 170 of FIG. 1A is embodied by a modulator 300 depicted in FIG. 3. Modulator 300 comprises a rounding operator (denoted by round(•)) 302, two unit delays (denoted by $z^{-1}$) 304 and 306, and three summing operators 301, 303, and 305. Unit delay 304 receives a rounding error $e_1$ and outputs a delayed rounding error $e_{1d}$. Summing operator 301 sums $N_{MUL}$ and $e_{1d}$ into a modified multiplication factor $N'_{MUL}$. Rounding operator 302 rounds $N'_{MUL}$ into $N_{DIV}$. Summing operator 303 subtracts $N_{DIV}$ from $N'_{MUL}$ to generate $e_1$. Summing operator 305 sums $N_C$ with $N_{DIV}$ and deducts $N_{MUL}$ to output an intermediate signal $N_{CNEXT}$. Unit delay 306 receives $N_{CNEXT}$ and outputs $N_C$. Rounding operator 302, summing operator 301 and 303, and unit delay 304 form a 1st order delta-sigma modulator, so that a mean value of $N_{DIV}$ equals $N_{MUL}$. Summing operator 305 and unit delay 306 form an error accumulator, so that $N_C$ is equal to an accumulative sum of a difference between $N_{DIV}$ and $N_{MUL}$. The difference between $N_{DIV}$ and $N_{MUL}$ is an instantaneous error of the 1st order delta-sigma modulator, and thus an error of the clock dividing operation of the clock divider 150. $N_C$, is the accumulative sum of a difference between $N_{DIV}$ and $N_{MUL}$, represents an accumulative error of the clock dividing operation of the clock divider 150 and thus a timing error of CK2. Digitally controlled timing adjustment circuit 160 corrects the timing error by adjusting the timing difference between CK2 and CK1 with an amount determined by $N_C$.

Figure 1F:
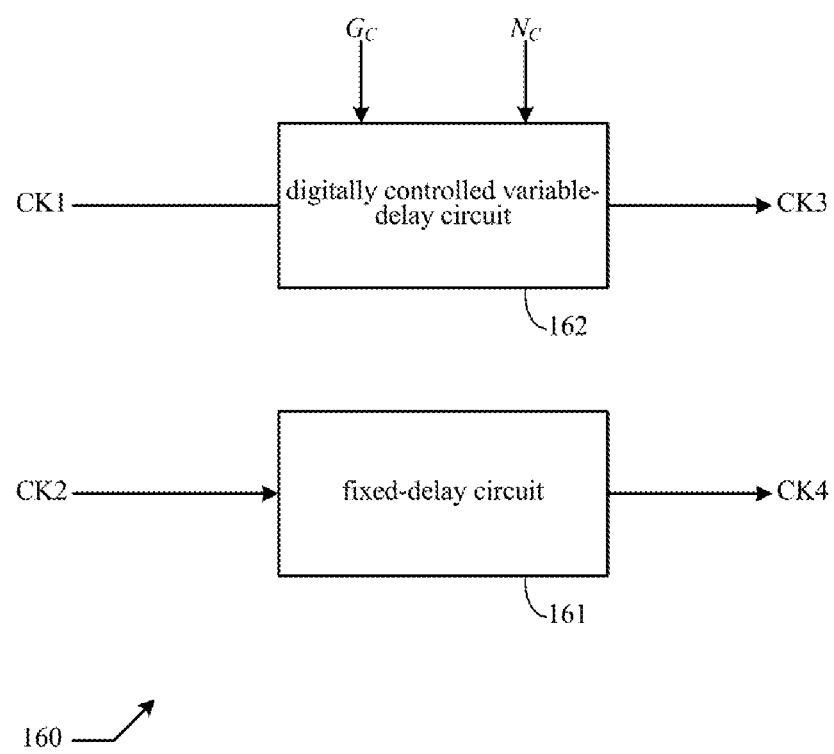
FIG. 1F shows a functional block diagram of a digitally controlled timing adjustment circuit.
Figure 1G:
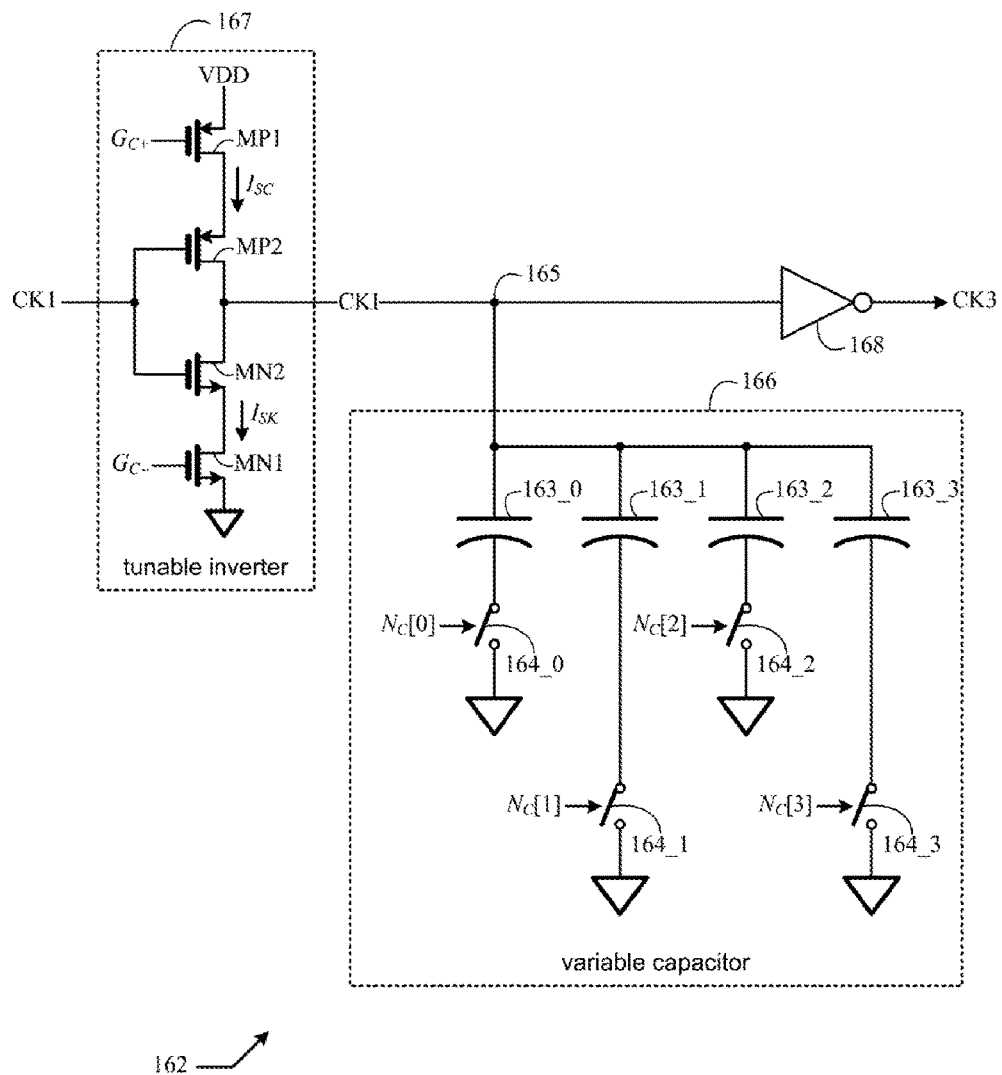
FIG. 1G shows a schematic diagram of a digitally controlled variable-delay circuit.

Now refer to FIG. 1F. In an alternative embodiment not shown in the figure, the fixed-delay circuit 161 and the digitally controlled variable-delay circuit 162 are swapped, and the digitally controlled variable-delay circuit 162 is controlled by $G_C$ and $-N_C$ instead, where $-N_C$ is an inversion of $N_C$. In this alternative embodiment, the timing difference between CK3 and CK1 is fixed and the timing difference between CK4 and CK2 is variable and controlled by $G_C$ and $-N_C$, but the function remains the same and equation (1) is fulfilled.

Still refer to FIG. 1F. The digitally controlled variable-delay circuit 162 belongs to a category of circuits known as digital-to-time converters, wherein a timing of an output clock is controlled by a digital signal. The digitally controlled variable-delay circuit 162 can be embodied by other digital-to-time converters, as long as the time difference between CK3 and CK1 is linearly dependent on both $N_C$ and $G_C$.

Now refer to FIG. 1A. PFD 110 is merely an exemplary timing detection circuit but not a limitation. An alternative timing detection circuit can be used instead, as long as the timing difference between CK4 and CK3 can be detected and properly represented by an associated timing error signal (such as $S_{TE}$). Also, VCO 140 is merely an exemplary controllable oscillator circuit but not a limitation. An alternative controllable oscillator circuit can be used instead, as long as an output clock (such as CK5) can be generated and a frequency of the output clock can be controlled by a control signal (such as $V_{CTL}$). Likewise, CP 120 and the subsequent LF 130 are an exemplary embodiment, but not a limitation, configured to filter a timing error signal (such as $S_{TE}$) generated by a preceding timing detection circuit (such as PFD 110) into a control signal (such as $V_{CTL}$). An alternative embodiment can be used instead, as long as the timing error signal can be filtered into a controllable signal for controlling a subsequent controllable oscillator circuit (such as VCO 140).

In accordance with an embodiment of the present invention, a flow chart 400 of a method comprises: receiving a first clock and a clock multiplication factor (step 401); modulating the clock multiplication factor into a division factor, wherein a mean value of the division factor is equal to the clock multiplication factor (step 402); establishing a noise cancellation signal in accordance with a difference between the clock multiplication factor and the division factor (step 403); deriving a third clock and a fourth clock from the first clock and a second clock using a digitally controlled timing adjustment circuit in accordance with a noise cancellation signal and a gain control signal (step 404); establishing a timing error signal by detecting a timing difference between the fourth clock and the third clock (step 405); filtering the timing error signal into an oscillator control signal (step 406); outputting a fifth clock in accordance with the oscillator control signal using a controllable oscillator (step 407); outputting the second clock by dividing down the fifth clock in accordance with the division factor (step 408); and adjusting the gain control signal in accordance with a correlation between the timing error signal and the noise cancellation signal (step 409).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
    a digitally controlled timing adjustment circuit configured to receive a first clock and a second clock and output a third clock and a fourth clock in accordance with a noise cancellation signal and a gain control signal;
    a timing detection circuit configured to receive the third clock and the fourth clock and output a timing error signal;
    a filtering circuit configure to receive the timing error signal and output an oscillator control signal;
    a controllable oscillator configured to receive the oscillator control signal and output a fifth clock;
    a clock divider configured to receive the fifth clock and output the second clock in accordance with a division factor;
    a modulator configured to receive a clock multiplication factor and output the division factor and the noise cancellation signal, wherein a mean value of the division factor is equal to the clock multiplication factor; and
    a calibration circuit configured to receive the timing error signal and the noise cancellation signal and output the gain control signal.

2. The circuit of claim 1, wherein a timing difference between the fourth clock and the third clock is equal to a sum of: a timing difference between the second clock and the first clock, the noise cancellation signal scaled by the gain control signal, and a fixed timing offset.

3. The circuit of claim 1, wherein the digitally controlled timing adjustment circuit comprises: a fixed-delay circuit configured to receive the second clock and output the fourth clock, and a digitally controlled variable-delay circuit configured to receive the first clock and output the third clock in accordance with the noise cancellation signal and the gain control signal.

4. The circuit of claim 3, wherein a delay of the digitally controlled variable delay circuit is linearly dependent on the noise cancellation signal and also linearly dependent on the gain control signal.

5. The circuit of claim 4, wherein the calibration circuit comprises a charge pump configured to receive the timing error signal and output an intermediate current signal in accordance with a common-mode feedback voltage, a single-pole-double-throw switch controlled by a sign of the noise cancellation signal, an integrator configured to receive the intermediate current signal via the single-pole-double-throw switch and output the gain control signal, and a common-mode feedback network configured to receive a first voltage at a positive input terminal and a second voltage at a negative input terminal of the integrator and output the common mode feedback voltage, wherein: a first throw of the single-pole-double-throw switch couples to the positive input terminal of the integrator, and a second throw of the single-pole-double-throw switch couples to the negative input terminal of the integrator.

6. The circuit of claim 5, wherein the integrator comprises a differential operational amplifier and two feedback capacitors.

7. The circuit of claim 6, wherein the single-pole double-throw switch is configured to steer the intermediate current to the positive input terminal of the integrator when the noise cancellation signal is of a first sign, and steer the intermediate current to the negative input terminal of the integrator when the noise cancellation signal is of a second sign.

8. The circuit of claim 1, wherein the modulator comprises a first order delta-sigma modulator.

9. The circuit of claim 1, wherein the controllable oscillator is a voltage-controlled oscillator.

10. The circuit of claim 1, wherein the clock divider is a counter.

11. A method comprising:
    receiving a first clock and a clock multiplication factor;
    modulating the clock multiplication factor into a division factor, wherein a mean value of the division factor is equal to the clock multiplication factor;
    establishing a noise cancellation signal in accordance with a difference between the clock multiplication factor and the division factor;
    deriving a third clock and a fourth clock from the first clock and a second clock using a digitally controlled timing adjustment circuit in accordance with the noise cancellation signal and a gain control signal;
    establishing a timing error signal by detecting a timing difference between the fourth clock and the third clock;
    filtering the timing error signal into an oscillator control signal;
    outputting a fifth clock in accordance with the oscillator control signal using a controllable oscillator;
    outputting the second clock by dividing down the fifth clock in accordance with the division factor; and
    adjusting the gain control signal in accordance with a correlation between the timing error signal and the noise cancellation signal.

12. The method of claim 11, wherein the digitally controlled timing adjustment circuit comprises: a fixed-delay circuit configured to receive the second clock and output the fourth clock, and a digitally controlled variable-delay circuit configured to receive the first clock and output the third clock in accordance with the noise cancellation signal and the gain control signal.

13. The method of claim 12, wherein a delay of the digitally controlled variable delay circuit is linearly dependent on the noise cancellation signal and also linearly dependent on the gain control signal.

14. The method of claim 11, wherein adjusting the gain control signal in accordance with a correlation between the timing error signal and the noise cancellation signal the calibration circuit comprises using a calibration circuit comprising: a charge pump configured to receive the timing error signal and output an intermediate current signal in accordance with a common-mode feedback voltage, a single-pole-double-throw switch controlled by a sign of the noise cancellation signal, an integrator configured to receive the intermediate current signal via the single-pole-double-throw switch and output the gain control signal, and a common-mode feedback network configured to receive a first voltage at a positive input terminal and a second voltage at a negative input terminal of the integrator and output the common mode feedback voltage, wherein: a first throw of the single-pole-double-throw switch couples to the positive input terminal of the integrator, and a second throw of the single-pole-double-throw switch couples to the negative input terminal of the integrator.

15. The method of claim 14, wherein the integrator comprises a differential operational amplifier and two feedback capacitors.

16. The method of claim 15, wherein the single-pole double-throw switch is configured to steer the intermediate current to the positive input terminal of the integrator when the noise cancellation signal is of a first sign, and steer the intermediate current to the negative input terminal of the integrator when the noise cancellation signal is of a second sign.

17. The method of claim 11, wherein modulating the clock multiplication factor into the division factor comprises using a first order delta-sigma modulator.

18. The method of claim 11, wherein the controllable oscillator is a voltage controlled oscillator.

* * * * *